United States Patent [19]

Glomski et al.

[11] Patent Number: 5,227,958
[45] Date of Patent: Jul. 13, 1993

[54] CARRIER AND INSERTION APPARATUS

[75] Inventors: Jacqueline D. Glomski, Arlington Heights; Richard H. Gosch, Westchester; Kevin Kent, Woodstock, all of Ill.

[73] Assignee: Motorola Inc., Schaumburg, Ill.

[21] Appl. No.: 860,624

[22] Filed: Mar. 30, 1992

[51] Int. Cl.[5] .............................. H05K 5/00
[52] U.S. Cl. .................. 361/399; 361/391; 361/394; 361/400; 361/412; 174/50; 211/41
[58] Field of Search ............. 361/391, 394, 399, 400, 361/412, 415, 420; 174/17 R, 50; 257/678; 211/41

[56] References Cited

U.S. PATENT DOCUMENTS

| | | | |
|---|---|---|---|
| 4,758,928 | 7/1988 | Wierec et al. | 361/415 |
| 5,014,163 | 5/1991 | Lin | 361/415 |
| 5,034,853 | 7/1991 | Mazura et al. | 361/391 |
| 5,128,833 | 7/1992 | Lin et al. | 361/415 |
| 5,170,894 | 12/1992 | Joist et al. | 211/41 |
| 5,184,283 | 2/1993 | Hamel | 361/395 |

Primary Examiner—Lincoln Donovan
Assistant Examiner—Young S. Whang
Attorney, Agent, or Firm—Timothy W. Markison; Steven G. Parmelee

[57] ABSTRACT

A carrier/insertion apparatus that has a U channel handle is improved to comprise an insertion portion, a stabilizer plate, and a deflector portion. The substrate that the carrier/insertion apparatus is mounted on comprises a carrier/insertion apparatus interface region that allows the carrier/insertion apparatus to mate thereto. As the carrier/insertion apparatus is slid into place, the deflector portion deflects the substrate a predetermined distance such that the carrier/insertion apparatus can be snapped into place. This arrangement allows for the carrier/insertion apparatus to be mounted on to a substrate without the use of mechanical hardware.

3 Claims, 2 Drawing Sheets

CARRIER AND INSERTION APPARATUS

FIELD OF THE INVENTION

This invention relates generally to PC board handles and in particular to an improved handle that can be securely fastened to the PC board without mounting hardware.

BACKGROUND OF THE INVENTION

PC board handles are known to act as a means for carrying a PC board and also for inserting a PC board into a card cage. A typical handle is comprised of a conductive material to prevent static discharges and is attached to the PC board using hardware, i.e. screws, washers, and nuts. With such hardware requirements, extra production steps are needed which reduces overall production efficiency. Therefore a need exists for an improved handle that eliminates the need for mounting hardware and increases production efficiency.

SUMMARY OF THE INVENTION

These needs and others can be substantially met by the improved carrier and insertion apparatus disclosed herein. The improved carrier and insertion apparatus is mounted on to a substrate, wherein the carrier and insertion apparatus includes a U channel handle that has a first plate, a second plate, and a third plate, wherein with respect to a first and second axis, the first plate and second plate are substantially parallel and are perpendicular to the third plate. The substrate includes an electrical interface portion that interfaces with an interface receptacle and a mating carrier and insertion apparatus interface region that deflects a predetermined distance.

The carrier and insertion apparatus is improved to comprise an insertion portion, a stabilizer plate, and a deflector portion. The insertion portion has a first insertion plate and a second insertion plate where, with respect to the first and second axis, the first insertion plate is substantially perpendicular to the second insertion plate. With respect to a third axis, the length of the second insertion plate is less than the length of the first insertion plate and the first insertion plate is coextensive of the third liquid plate of the handle.

The stabilizer plate is mechanically coupled to the second plate of the handle and, with respect to the third axis, is substantially perpendicular to the second plate of the handle. Further, with respect to the third axis, the stabilizer plate is substantially perpendicular to the first insertion plate and wherein a first edge of the stabilizer plate is a predetermined distance from a first surface of the first insertion plate.

The deflection portion, with respect to the first surface of the first insertion plate, has a predetermined angular surface and is mechanically coupled to the second plate of the handle. The predetermined angular surface is substantially perpendicular to the second plate of the handle and is a predetermined distance from the surface of the first insertion plate such that it deflects the substrate when the insertion/carrier apparatus is installed on the substrate.

DESCRIPTION OF A PREFERRED EMBODIMENT

The present invention provides an improved handle that can be securely mounted to a printed circuit board without the use of mechanical fasteners. A right angle ledge on the handle is inserted into an elongated slot on the printed circuit board to maintain alignment during assembly. The handle is then slid onto the printed circuit board along the slot until it locks in place. The locking tab acts as a cantilever snap. When the handle has reached the final range of motion, the tab snaps into a notch on the printed circuit board and locks the two components together. During assembly, the deflectors ride along the edge of the printed circuit board. The angular shape of the deflectors forces the printed circuit board to deflect at the mating area of the deflectors. This interference fit securely mates the two parts together. Once fully assembled, the stabilizer prevents any movement of the handle.

Figure 1:
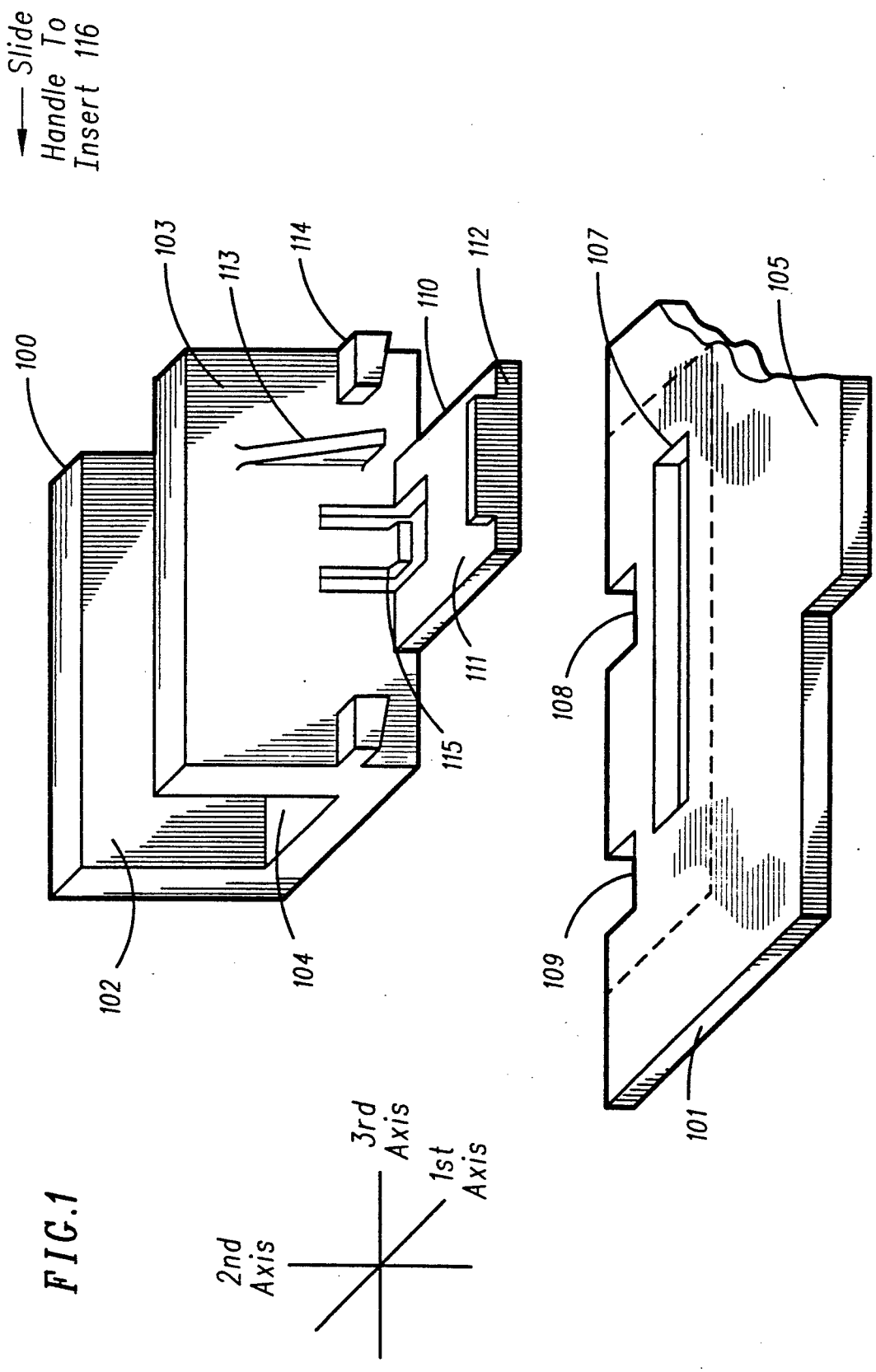
FIG. 1 illustrates an isometric view of an implementation of an carrier/insertion apparatus and an associated substrate.
Figure 2:
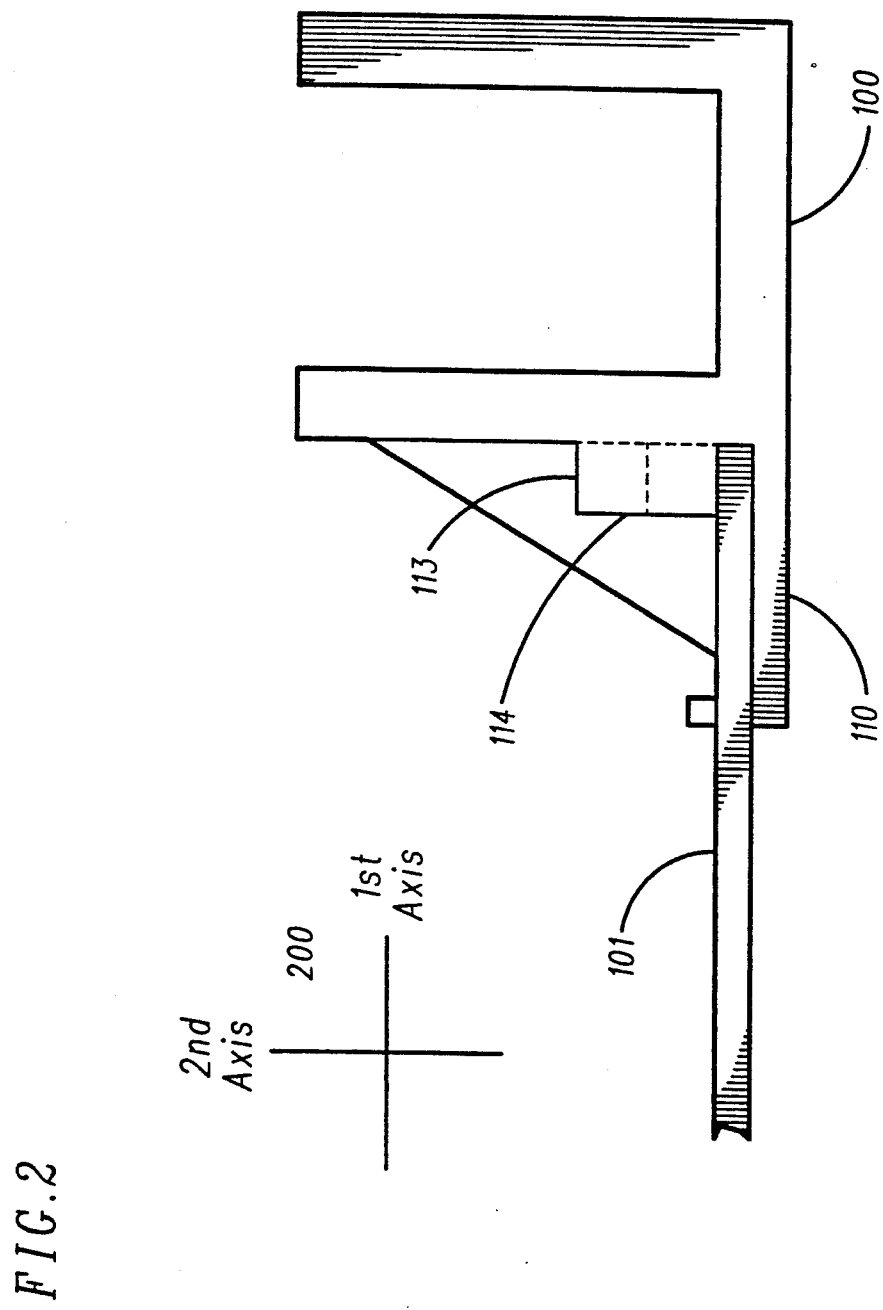
FIG. 2 illustrates a side view of the carrier and insertion apparatus and the substrate of FIG. 1.

The present invention can be more fully described with reference to FIGS. 1 and 2. FIG. 1 illustrates, with respect to a first, second, and third axis system 117, a substrate 101 and a carrier and insertion handle 100. The substrate 101, which may be a printed circuit board, comprises an electrical interface 105, a mating carrier and insertion region 106, a slot 107, and first and second notches 108 and 109. The carrier and insertion handle 100, which may be a static resistant plastic molded part, comprises a first plate 102, a second plate 103, a third plate 104, an insertion portion 110, a first insertion plate 111, a second insertion plate 112, a stabilizer 113, a deflector 114, and a locking tab 115.

The printed circuit board 101, comprises a slot 107 which is a predetermined length that is less than the length of insertion portion 110 and greater than the length of the second insertion plate 112. For example the dimensions of the slot 107 may be approximately 1.5 inches long and a width of 0.06 inches. The slot 107 locates and guides the second insertion plate 112 during assembly. The second notch 109 is approximately 0.4 inches wide and 0.1 inches deep, and function to locate the deflector 114 prior to assembly. The second notch 109 also provides the predetermined deflection required of the mating carrier and insertion region 106 during assembly.

The width of the first notch 108 is greater than the width of locking tab 115. For example, the first notch may have dimensions of 0.26 inches wide and 0.1 inches deep. In addition, the first notch 108 functions as a non-moving member of the assembly locking mechanism.

The carrier and insertion handle 100 may be molded from a statically dissipative plastic, a platable plastic, or a conductive plastic. By using a static dissipative material, an electro-static charge is discharged before it can damage components on the printed circuit board. The first plate 102 of the carrier and insertion handle 100 is part of a U channel and provides a surface for pulling, with respect to the first axis, the electrical interface 105 from its mating receptacle. The second plate 103 comprises another portion of the U channel and provides, with respect to the first axis, a surface for pushing the electrical interface 105 into its mating receptacle. The third plate 104 makes up to the third portion of the U-channel and provides the space needed for a hand to grip the first plate 102 or second plate 103.

Geometrically, the first insertion plate 111 of the insertion portion 110 is perpendicular to the second plate 103 of the U channel and is shorter in length. For example, the length of the first insertion plate 111 may be 1.65 inches while the length of the second plate 103 may be 2.76 inches. The width of first insertion plate 111 determines the location of the slot 107 on the PC board 101. The second insertion plate 112 of the insertion portion 110 is a right angle ledge with respect to the first insertion plate 111 and may have dimensions of 1.14 inches in length and 0.05 inches in width. To mount the handle 100 to the PC board 101, the second insertion plate 112 is inserted into slot 107 and provides alignment. The second insertion plate 112 also provides required shear strength to withstand the force needed to pull the electrical interface 105 from its mating receptacle which may be about 30 lbs of force.

The stabilizer 113 prohibits motion of the carrier and insertion handle in the second axis 117. The first edge of the stabilizer 113 contacts the circuit board after assembly thus preventing motion in the first axis. The deflectors 114 are an extension of the second plate 103, where one edge of the deflectors is a predetermined angle such as 15 degrees. The angular portion of the deflectors creates an interference fit during assembly forcing the circuit board to deflect a predetermined distance. The locking tab 115 is 0.20 inches in width and 0.54 inches in height. Note that the width of the locking tab is less than the width of the first notch 108 (0.26 inches).

To assemble the carrier and insertion handle 100 on to the printed circuit board 101, the second insertion plate 112 is inserted through slot 107. Once in place, the carrier and insertion handle 100 is slid in the direction indicated 116. The deflectors 114 will engage the mating/carrier insertion region 106 and deflect the PC board in the area of the second notch 109 a predetermined distance. The interference fit between the deflectors 114 and the mating/carrier insertion region 106 mechanically couples the carrier and insertion handle 100 to the printed circuit board 101. At the end of the engagement, the locking tab 115 will drop in to the notch 108 and lock the assembly together, which is illustrated in FIG. 2 with respect to the first and second axis 200.

The above describes a carrier and insertion apparatus for use with printed circuit boards or similar plate devices. This invention allows a handle to be assembled to a substrate without the use of additional mechanical fasteners. In addition, the carrier and insertion handle eliminates the need for tools, minimizes production steps and manual assembly time and is therefore beneficial for any type of assembly that requires the use of a handle.

We claim:

1. An improved carrier and insertion apparatus that is mounted on a substrate, wherein the carrier and insertion apparatus includes a U-channel handle having an first plate, a second plate and a third plate, wherein, with respect to a first axis and a second axis, the first plate and the second plate are substantially parallel and are substantially perpendicular to the third plate, wherein the substrate includes a mating carrier and insertion apparatus interface region, and wherein the substrate, at the mating carrier and insertion apparatus region, deflects a predetermined distance, wherein the improved carrier/insertion apparatus comprises:

insertion portion having a first insertion plate and second insertion plate, wherein, with respect to the first axis and the second axis, the first insertion plate is substantially perpendicular to the second insertion plate, wherein, with respect to a third axis, length of the second insertion plate is less than length of the first insertion plate, wherein the first insertion plate is coextensive of the third plate of the handle, and wherein, when the improved carrier and insertion apparatus is mounted on the substrate, the second insertion plate is mechanically coupled to the mating carrier and insertion apparatus interface region;

at least one stabilizer plate that is mechanically coupled to the second plate on the handle, wherein, with respect to the third axis, the stabilizer plate is substantially perpendicular to the second plate of the handle, wherein, with respect to the third axis, the stabilizer plate is substantially perpendicular to the first insertion plate, and wherein a first edge of the stabilizer plate is a predetermined distance from a first surface of the first insertion plate; and deflector portion having, with respect to the first surface of the first insertion plate, a predetermined angular surface, wherein the deflector portion is mechanically coupled to the second plate of the handle and the predetermined angular surface is substantially perpendicular to the second plate of the handle, and wherein the predetermined angular surface is the predetermined distance from the first surface of the first insertion plate.

2. The improved carrier and insertion apparatus of claim 1 further comprises a deflecting locking tab that is coextensive of the second plate of the handle and having a raised portion that extends beyond the surface of the second plate of the handle.

3. An improved method for mounting a carrier and insertion apparatus on to a substrate, wherein the carrier and insertion apparatus includes a U-channel handle having an first plate, a second plate and a third plate, wherein, with respect to a first axis and a second axis, the first plate and the second plate are substantially parallel and are substantially perpendicular to the third plate, the method comprises the step of:

a) fabricating, on the carrier and insertion apparatus, an insertion portion, at least one stabilizer plate, and a deflector portion;

b) fabricating, on the substrate, a mating carrier and insertion interface apparatus region, wherein the mating carrier and insertion interface apparatus region includes and alignment slot that accepts the insertion portion;

c) when the carrier and insertion apparatus is being mounted on the substrate, positioning the carrier and insertion apparatus in alignment with an initializing portion of the substrate; and d) engaging the deflector portion when the carrier and insertion apparatus is substantially positioned by deflecting the substrate by a predetermined distance.

* * * * *